United States Patent
Li et al.

(10) Patent No.: US 9,142,416 B1
(45) Date of Patent: Sep. 22, 2015

(54) PROCESS TO REDUCE NODULE FORMATION IN ELECTROLESS PLATING

(71) Applicant: Lam Research Corporation, Fremont, CA (US)

(72) Inventors: Nanhai Li, Pleasanton, CA (US); Xiaomin Bin, San Jose, CA (US); Yaxin Wang, Fremont, CA (US); Marina Polyanskaya, Morgan Hill, CA (US); Novy Tjokro, Union City, CA (US); Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/276,877

(22) Filed: May 13, 2014

(51) Int. Cl.
*H01L 21/44* (2006.01)
*H01L 21/288* (2006.01)
*H01L 21/768* (2006.01)

(52) U.S. Cl.
CPC ........ *H01L 21/288* (2013.01); *H01L 21/76874* (2013.01)

(58) Field of Classification Search
CPC ............... H01L 21/76874; H01L 2924/01029; C23C 22/63; C23C 22/60
USPC ..................................... 438/678, 745
See application file for complete search history.

(56) References Cited

U.S. PATENT DOCUMENTS

| | | | | |
|---|---|---|---|---|
| 6,127,282 | A * | 10/2000 | Lopatin .................. | 438/754 |
| 2005/0208774 | A1 * | 9/2005 | Fukunaga et al. ........... | 438/745 |
| 2007/0224811 | A1 * | 9/2007 | Wang et al. ................. | 438/678 |
| 2008/0236872 | A1 * | 10/2008 | Kataoka et al. ............. | 174/254 |

* cited by examiner

*Primary Examiner* — Trung Q Dang
(74) *Attorney, Agent, or Firm* — Bayer Law Group LLP

(57) ABSTRACT

A method for providing electroless deposition of a metal layer on a plurality of metal patterns, wherein a dielectric surface is between some of the plurality of metal patterns and metal residue is on the dielectric surface is provided. The dielectric surface is pretreated with an alkaline solution with a pH of at least 8 comprising at least one complexing agent, wherein the complexing agent forms a metal complex with the metal residue and wherein some metal oxide residue remains. The dielectric surface is pretreated with an acidic solution, wherein the acidic solution dissolves metal oxide residue. Metal is electrolessly deposited on the plurality of metal patterns.

15 Claims, 2 Drawing Sheets

PROCESS TO REDUCE NODULE FORMATION IN ELECTROLESS PLATING

BACKGROUND OF THE INVENTION

Field of the Invention

The invention relates to a method of forming semiconductor devices on a semiconductor wafer. More specifically, the invention relates to depositing metal layer using electroless plating to form semiconductor devices.

In forming semiconductor devices, thin layers of a metal may be deposited. Such a deposition may be provided by electroless plating.

SUMMARY OF THE INVENTION

To achieve the foregoing and in accordance with the purpose of the present invention, a method for providing electroless deposition of a metal layer on a plurality of metal patterns, wherein a dielectric surface is between some of the plurality of metal patterns and metal residue is on the dielectric surface is provided. The dielectric surface is pretreated with an alkaline solution with a pH of at least 8 comprising at least one complexing agent, wherein the complexing agent forms a metal complex with the metal residue and wherein some metal oxide residue remains. The dielectric surface is pretreated with an acidic solution, wherein the acidic solution dissolves metal oxide residue. Metal is electrolessly deposited on the plurality of metal patterns.

In another manifestation of the invention, a method for providing electroless deposition of a Co or Ni containing layer on a plurality of Cu containing patterns, wherein a dielectric surface is between some of the plurality of Cu containing patterns and Cu residue is on the dielectric surface is provided. The dielectric surface with an alkaline solution with a pH of at least 8 comprising at least one complexing agent, wherein the complexing agent forms a negatively charged metal complex with the Cu residue and wherein some CuO residue remain. The dielectric surface is pretreated with an acidic solution, wherein the acidic solution dissolves metal oxide residue. Co or Ni is electrolessly deposited on the plurality of Cu containing patterns.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Nodules are one of the most typical surface defects that electroless plating leaves behind on a patterned wafer. The formation of these nodules can be the result of insufficient surface cleaning, unstable deposition solution, or substrate (Cu) etching due to long initiation time of deposition process, which can cause deposition solution contamination and homogeneous particle formation. One typical example is electroless plating of Co film on patterned Cu with dielectric surfaces between the Cu patterns. Most often, the dielectric surface and Cu surfaces are cleaned with acidic solution to remove Cu oxide and other chemical mechanical polishing residues. This step is followed by electroless deposition of Co. If electroless Co plating is pursued without pre clean, the electroless deposition would deposit on the residues forming nodules on the dielectric surface, which cause defects.

Figure 1:
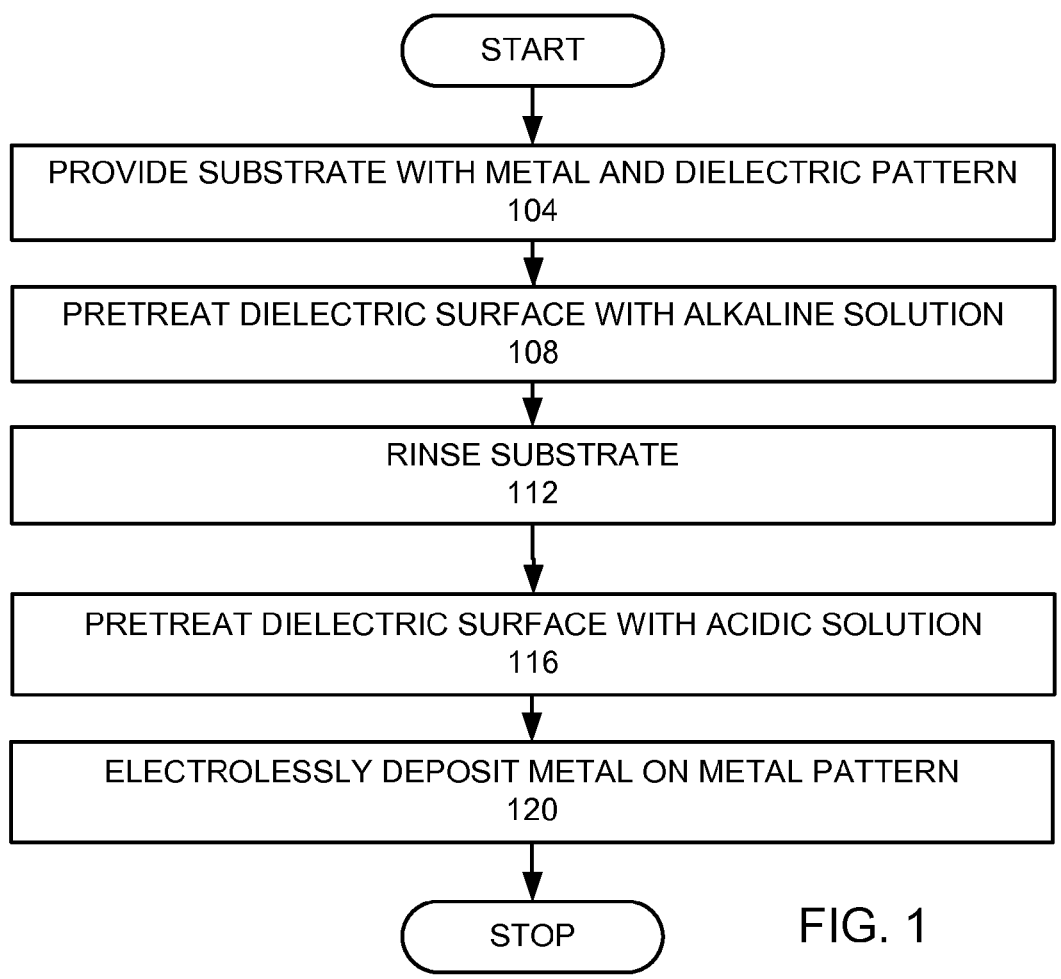
FIG. 1 is a flow chart of an embodiment of the invention.

FIG. 1 is a high level flow chart of an embodiment of the invention. In this embodiment, a substrate with metal and dielectric surface patterns is provided (step 104). The dielectric surface is pretreated with an alkaline solution with a pH of at least 8 and comprising at least one complexing agent, where the complexing agent forms a negatively charged metal complex with metal residue on the dielectric surface and where some metal oxide residue remains (step 108). The substrate is rinsed (step 112). The dielectric surface is pretreated with an acidic solution, which dissolves metal oxide residue (step 116). Metal is electrolessly deposited on the metal surface patterns (step 120).

Figure 2A:
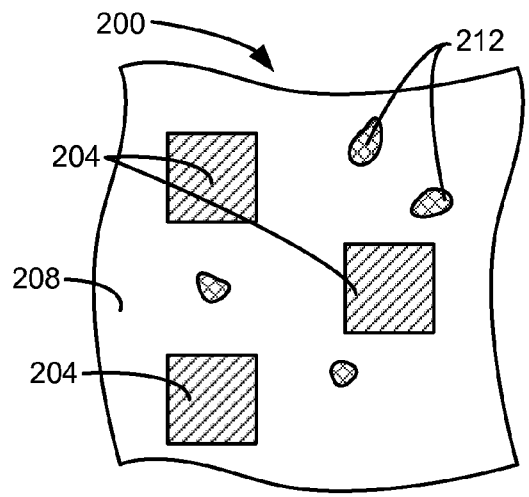
FIGS. 2A-D are schematic views of a system that may be used in an embodiment of the invention.

In an example, a substrate with metal and dielectric surface patterns is provided (step 104). FIG. 2A is a partial view of a substrate 200 with a plurality of metal pattern surfaces 204 and dielectric surfaces 208. In this embodiment, the metal pattern surfaces 204 are copper. The dielectric surfaces 208 are an ultra low-k material, such as porous SiOC, SiCOH, where a barrier layer is placed between the dielectric surfaces 208 and the metal pattern surfaces 204. Due to imperfections in the formation of the metal pattern surfaces 204 or other processes performed on the substrate, such as CMP, metal residue 212 is deposited on the dielectric surfaces 208.

The dielectric surfaces 208 are pretreated with an alkaline solution with a pH of at least 8 and comprising at least one complexing agent. Preferably, the complexing agent forms a negatively charged metal complex with the metal residue 212 on the dielectric surfaces 208 and where some of the metal oxide residue remains (step 108). More preferably, the pH of the alkaline solution is at least 9. Most preferably, the pH of the alkaline solution is at least 10. In an embodiment, the alkaline solution may form a metal oxide from the metal residue. A sample recipe for this embodiment of the invention provides a solution of citrate, oxalate or ethylenediaminetetraacetic acid (EDTA) with pH adjusted to 10 with TMAH or ammonia solution.

Figure 2B:
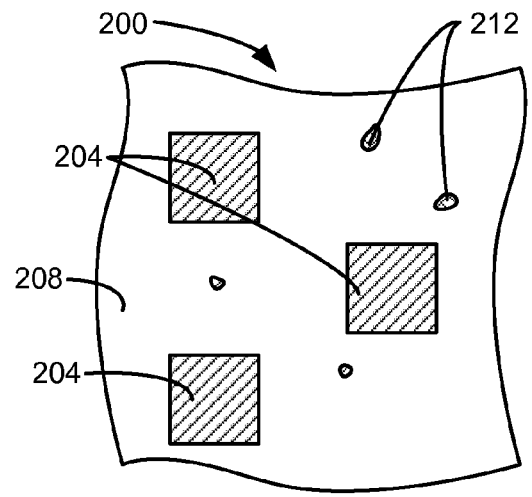

The dielectric surfaces 208 are rinsed (step 112). In this embodiment deionized water (DI) is used to rinse the dielectric surfaces 208. FIG. 2B is a partial view of the substrate 200 after the rinse. The metal residue 212 is reduced. Although for illustrative purposes the reduced metal residue 212 is shown by showing a reduced width, such a reduction may be in width and/or thickness of the metal residue 212.

Without being bound by theory, it is believed that the alkaline solution with the complexing agent dissolves some of the metal residue forming negatively charged metal complexes, such as a metal with citrate, oxalate, and EDTA ligands. The rinse removes the metal complex, reducing the metal residue 212. In the alkaline solution, the charge of the dielectric surface is less positive or negatively charged. This cause less electrostatic attraction between the negatively charged metal complex and the dielectric surfaces 208, and even greater repelling between the dielectric surfaces 208 and the negatively charged metal complex, which increases the removal of metal residue 212. However, it is believed that metal will form metal oxide in the alkaline medium, therefore, there will be some metal oxides still present on the surface after alkaline pre clean and DI water rinse thereafter.

The dielectric surfaces 208 are pretreated with an acidic solution with a pH of less than pH 6 (step 108). In some embodiments the acidic solution has a complexing agent. Preferably, the complexing agent forms a negatively charged metal complex. In other embodiments, the acidic solution is free of complexing agent. A sample recipe for this embodiment of the invention provides a solution of citric acid or oxalic acid. A rinse step with deionized water (DI) is typically used but not necessarily required.

Figure 2C:
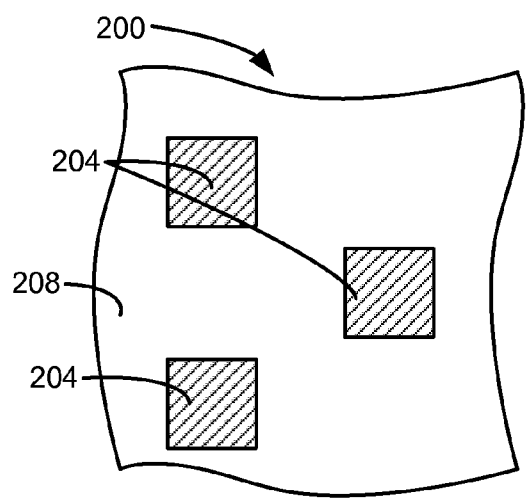

Without being bound by theory, it is believed that the acidic solution will dissolve remaining metal oxide metal residue 212 forming a metal ion and water. The metal ion may form a metal complex if a complexing agent is present. FIG. 2C is a partial view of the substrate 200 after the pretreatment with the acidic solution (step 116). The metal residue has been removed. Preferably, all of the metal residue has been removed.

Metal is electrolessly deposited on the metal pattern surfaces 204. In this embodiment, cobalt (Co) is deposited on copper metal pattern surfaces 204. A sample recipe for such a deposition provides a solution of 0.1 mol/L $CoSO_4.7H_2O$, 0.3 mol/L Citric acid, 0.001 mol/L $Na_2WO_4$, 0.07 mol/L $NaH_2PO_2$, 0.07 mol/L $(CH_3)_2NHBH_3$. The pH is adjusted to 9.5-9.7 with 25% TMAH. A plating temperature 80-85° C. is provided.

Figure 2D:
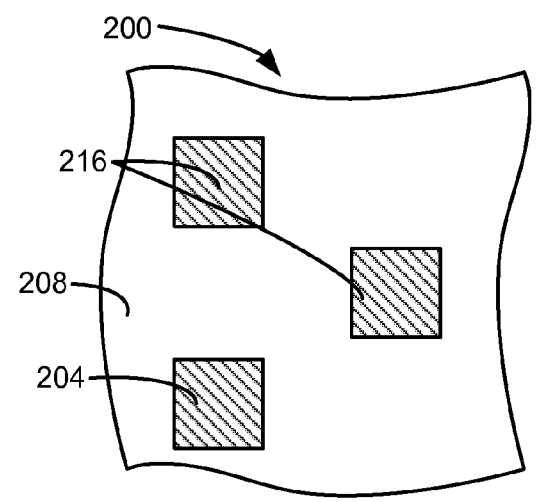

FIG. 2D is a partial view of the substrate 200 after the electroless deposition (step 120). The electroless deposition of cobalt, forms patterned cobalt surfaces 216. Because the metal residues have either been entirely removed or reduced, the formation of deposition nodules is avoided or minimized.

Preferably, these processes are performed in a low or no oxygen environment to reduce or eliminate the formation of a metal oxide. In other embodiments, the processes are performed in normal oxygen environments. In embodiments the complexing agent is at least one of oxalate, citrate, tartrate, or ethylenediaminetetraacetic acid (EDTA). In other embodiments, the electrolessly deposited metal is nickel. In other embodiments, the patterned metal surfaces are any metal and the electrolessly deposited metal is any metal.

It has been unexpectedly found that by first providing an alkaline pretreatment with a complexing agent that forms a negatively charged metal complex, and then an acidic pretreatment the metal residue is sufficiently reduced to avoid or eliminate nodules, providing an improved electroless deposition.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for providing electroless deposition of a metal layer on a plurality of metal patterns, wherein a dielectric surface is between some of the plurality of metal patterns and metal residue is on the dielectric surface, comprising:
    pretreating the dielectric surface with an alkaline solution with a pH of at least 8 comprising at least one complexing agent, wherein the complexing agent forms a metal complex with the metal residue and wherein some metal oxide residue remain;
    pretreating the dielectric surface with an acidic solution, wherein the acidic solution dissolves metal oxide residue;
    electrolessly depositing metal on the plurality of metal patterns.

2. The method, as recited in claim 1, wherein the metal complex is negatively charged.

3. The method, as recited in claims 2, further comprising rinsing the dielectric surface with deionized water after pretreating the dielectric surface with the alkaline solution and before pretreating the dielectric surface with the acidic solution.

4. The method, as recited in claim 3, wherein the pretreating the dielectric surface with an alkaline surface causes the dielectric surface to have a negative charge.

5. The method, as recited in claim 4, wherein the pretreating the dielectric surface with the alkaline solution and pretreating the dielectric surface with the acidic solution remove all metal residue.

6. The method, as recited in claim 5, wherein the complexing agent is at least one of oxalate, citrate, ammonia, tartrate and EDTA.

7. The method, as recited in claim 6, wherein plurality of metal patterns contain copper.

8. The method, as recited in claim 7, wherein the deposited metal layer contains at least one of Co or Ni.

9. The method, as recited in claim 2, wherein the pretreating the dielectric surface with an alkaline surface causes the dielectric surface to have a negative charge.

10. The method, as recited in claim 2, wherein the pretreating the dielectric surface with the alkaline solution and pretreating the dielectric surface with the acidic solution remove all metal residue.

11. The method, as recited in claim 2, wherein the complexing agent is at least one of oxalate, citrate, ammonia, tartrate and EDTA.

12. The method, as recited in claim 2, wherein plurality of metal patterns contain copper.

13. The method, as recited in claim 2, wherein the deposited metal layer contains at least one of Co or Ni.

14. A method for providing electroless deposition of a Co or Ni containing layer on a plurality of Cu containing patterns, wherein a dielectric surface is between some of the plurality of Cu containing patterns and Cu residue is on the dielectric surface, comprising:
    pretreating the dielectric surface with an alkaline solution with a pH of at least 8 comprising at least one complexing agent, wherein the complexing agent forms a negatively charged metal complex with the Cu residue and wherein some CuO residue remain;
    pretreating the dielectric surface with an acidic solution, wherein the acidic solution dissolves metal oxide residue;
    electrolessly depositing Co or Ni on the plurality of Cu containing patterns.

15. The method, as recited in claim 14, wherein the complexing agent is at least one of oxalate, citrate, ammonia, tartrate and EDTA.

* * * * *